Oct. 19, 1954 N. PRITIKIN 2,692,190

METHOD OF MAKING INLAID CIRCUITS

Filed Aug. 17, 1953

INVENTOR.
Nathan Pritikin.
BY
Thiess, Olson, Mecklenburger, von Holst, & Coltman. Attys.

Patented Oct. 19, 1954 2,692,190

UNITED STATES PATENT OFFICE 2,692,190

METHOD OF MAKING INLAID CIRCUITS

Nathan Pritikin, Chicago, Ill.

Application August 17, 1953, Serial No. 374,603

13 Claims. (Cl. 41—42)

This invention relates to a method of making inlaid circuits, and it is an object of the invention to provide an improved method of that character.

It is common practice in the manufacture of large quantities of duplicate circuits to employ so-called printed circuits. It is desirable in most cases, that such printed circuits have a flush surface, that is, that the electrical conductors be embedded in the insulating base material so that the exposed surfaces of the conductors are flush with that of the base. This is particularly true when movable electrical contact is to be made with portions of the circuit. Most commonly the electrical conductors are first laid on a temporary base by printing, by an etched foil process, or by an electrolytic process. Subsequently, the material which is to constitute the permanent base is pressed against the exposed surfaces of the conductors and against the exposed surface of the temporary base. Following this the printed circuit, that is, the permanent base and the embedded conductors, is stripped from the temporary base. In order to permit this last step it is necessary, when electrolytically depositing the circuit on a temporary base, to treat the surface of the cathode, which serves as the temporary base, by any one of several known methods, to prevent too firm a bond between the temporary base and the deposited metal. For example, an oxide may be permitted or encouraged to form on the surface of the cathode or a very thin film of grease may be applied. In either case, the intervening foreign material permits the deposited metal to be stripped from the temporary base very readily, and at the same time is sufficiently thin that the applied voltage may act across the barrier film to cause reasonably uniform deposition of metal.

With the methods presently being employed in making inlaid circuits, considerable difficulty is experienced in obtaining a truly flush surface. One fault which commonly occurs is that the material which constitutes the permanent base for the circuit flows partially over the surface of the circuit which adheres only lightly to the cathode and which is intended to be exposed in the completed product. This common fault results from the fact that the material constituting the circuit is not bonded to the temporary base with sufficient adhesion or cohesion to prevent the material constituting the permanent base from seeping between the circuit material and the temporary base. This is particularly true where the material constituting the permanent base is a thermosetting plastic which is cured under substantial pressure as well as a high temperature. When this fault occurs, the inlaid circuit becomes a reject. The particular portion of the circuit improperly covered by the base material may, for example, be intended to be exposed in order that electrical contact can be made therewith. Also, the portion of the printed circuit which is lifted off the face of the temporary base by the pressure of the base material may be distorted to the extent that a high resistance area or even an open circuit is produced.

According to the present invention the printed circuit is bound to the temporary base so firmly that for all practical purposes it cannot be removed. More specifically, the material of the printed circuit becomes substantially one piece of metal with the temporary base with the result that no method employed for applying the permanent base to the printed circuit can result in seepage of the permanent base material between the printed circuit and the temporary base.

Accordingly, it is another object of the invention to provide an improved method of producing printed circuits whereby a smooth flush surface is assured.

It is another object of the invention to provide an improved method of producing inlaid circuits in which the printed circuit is bound to the temporary base so firmly as to eliminate the seepage of the material of the permanent base between the printed circuit and the temporary base.

It is another object of the invention to provide an improved method of producing inlaid circuits which has the advantages specified above while being accurate, reliable, and economical to employ.

This invention, together with further objects and advantages thereof, will best be understood by reference to the following description taken in connection with the accompanying drawing and its scope will be pointed out in the appended claims.

In the drawing, in which like parts are designated by like reference numerals,

Fig. 1 is a cross-sectional view of a temporary base employed in one embodiment of the invention;

Figs. 2, 3, 4, and 5 are views similar to Fig. 1 but illustrating succeeding steps in the formation of a printed circuit on the temporary base in accordance with one embodiment of the invention;

Figure 8:
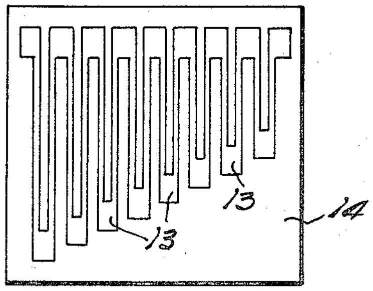
Fig. 8 is a plan view of a printed circuit which may be produced in accordance with the present invention.

The embodiment of the invention illustrated in the drawings discloses the invention as applied to a resistance element which may be employed in the construction of a potentiometer. It is to be noted that the term "inlaid circuit," as employed herein, is to be interpreted in its broadest sense, whereby it includes not only a maze of conducting strips which constitute the conventional idea of a printed circuit, but also such simple arrangements as the resistance element disclosed in Fig. 8 and even simpler arrangements. More specifically, the term is intended to include any conducting element embedded in an insulating material for the purpose of carrying electricity.

In the embodiment of the invention illustrated in the drawings a temporary base 11 is employed which preferably constitutes a thin copper sheet, namely, one on the order of five mils thick. A sheet of this thickness permits convenient handling of the assembly during process. However, a heavier sheet may, if desired, be employed, and a very thin film or foil may be employed, but in the latter case the foil is preferably backed up by a relatively stiff base to which the film adheres lightly.

In accordance with the preferred embodiment of the invention, the copper sheet 11 is to be used as a cathode upon which the conducting material of the ultimate printed circuit is electrolytically deposited. Since the conducting material is to be deposited in a desired configuration, it is necessary that some form of insulating resist be applied to one surface of the copper sheet. In accordance with the preferred embodiment of the invention, this is accomplished photographically.

Figure 1:
Figure 2:
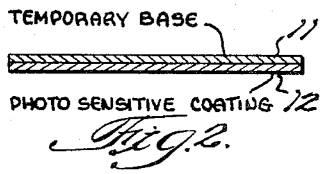

In Fig. 2 a photosensitive coating 12 is shown applied to one surface of the copper sheet 11. This photosensitive coating may, for example, be a solution of shellac sensitized by a bichromate solution. Since a photosensitive coating of this character is commonly employed in the art, it is not described in detail herein.

The photosensitive coating is exposed to activating rays, such as light, in a pattern which is the negative of the desired ultimate configuration of the conducting material of the printed circuit. After exposure the photosensitive coating is developed and fixed in the manner normally employed in treating this common form of photosensitive coating. As a result of this process the nonactivated portions of the photographic emulsion are washed away, leaving a residue coating 12′ in a pattern which is the negative of the desired ultimate configuration of the conducting material of the printed circuit (see Fig. 3). Preferably, this residue coating 12′ is subjected to a temperature on the order of 250° F. for fifteen minutes to drive out moisture and to set the coating. This makes the coating more durable and thus better able to stand up during subsequent operations.

Figure 3:
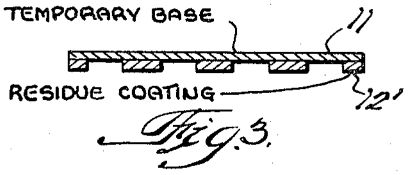

In accordance with this invention, conducting material for the printed circuit is to be bonded to the base sheet 11 with the tightest possible, direct metal-to-metal bond. Accordingly, at least the remaining exposed portion of the lower surface of the sheet 11, in Fig. 3, is made chemically clean. This may be accomplished by dipping the assembly of Fig. 3 in a 10% solution of sulphuric acid. It should be noted that this bath will not destroy the residue coating 12′.

According to the preferred embodiment of the invention, the entire assembly of Fig. 3 is then immersed in an electrolytic bath containing a silver salt, and silver is electrolytically deposited on the exposed portions of the lower surface of the copper sheet 11. During this process the reverse or upper side of the copper sheet may be protected by an over-all coating of any suitable nonconducting material in order to prevent deposition of silver on the reverse side.

Figure 4:
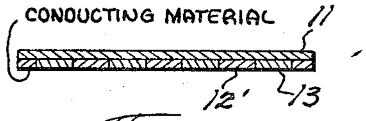

The silver so deposited on the exposed portions of the lower surface of the copper sheet then constitutes the conducting portions 13 of the ultimate printed circuit and is in the desired configuration (see Fig. 4).

Since copper is electropositive with respect to silver in the electromotive series, silver may be chemically deposited on the copper prior to the application of voltage necessary for electrolytic deposition. To avoid this chemical deposition, which tends to be coarse and structurally weak, a thin film of silver, on the order of .1 mil thick, may be electrolytically deposited from a "strike" solution before employing the conventional electrolytic bath. Such a strike solution is very low in silver as compared to the conventional electrolytic bath and, accordingly, substantially no silver is chemically deposited on the copper from this solution. Since the use of a strike solution is common in electrolytic deposition of metals, this step is not described in detail herein.

Figure 5:
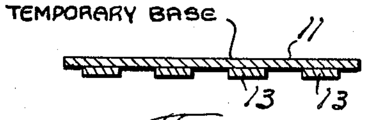

The residue coating 12′ may then be removed by treating with a suitable organic solvent such as alcohol or an alkaline solution of lye, leaving only the deposited metal 13 on the sheet 11 as in Fig. 5. These agents have no detrimental effect upon either the copper sheet 11 or the electrolytically deposited silver 13.

Figure 6:
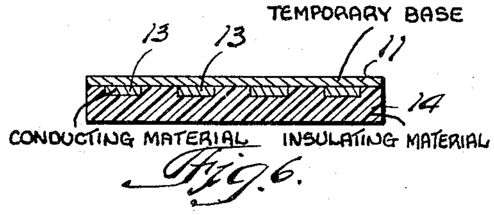
Fig. 6 is a similar view showing a permanent base added to the assembly of Fig. 5.

Next a suitable insulating material 14 which is to form the permanent base of the inlaid printed circuit is applied against the deposited silver and against the exposed portions of the lower surface of the copper sheet 11, as in Fig. 6. This material should be in plastic form in order that it may be made to come into intimate contact with all exposed surfaces. Preferably this material is a plastic such as Teflon or polystyrene, but may be any thermoplastic or thermosetting plastic or any hardenable insulating material suitable for the purpose. During this step the copper sheet 11 is permitted to lie against a flat rigid base. Where thermosetting plastics are employed as the permanent base 14 they may at this point be thermally set by application of elevated temperatures suitable for the particular thermosetting plastic employed. Preferably a substantial pressure is also applied in order to insure firm and uniform contact between the plastic and the exposed surfaces of the copper and the silver. The application of pressure is desirable for this reason regardless of the material used for the permanent base.

Figure 7:
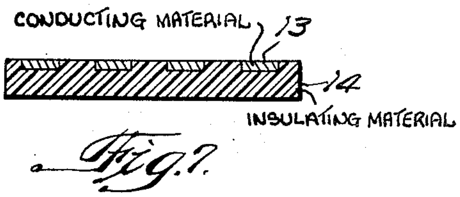
Fig. 7 is a view similar to Fig. 6 but showing the temporary base removed.

After the base 14 has been thermally set or otherwise brought to its final form, the copper sheet 11 is etched away to expose the surfaces of the silver 13 and the base 14 which were previously in contact with the copper sheet, as seen in Fig. 7. In the specific embodiment of the invention described above, namely, where a copper sheet 11 is employed along with a silver deposition 13 and any form of thermosetting plastic for the base 14, the copper sheet may be removed by a 40° Baumé, water solution of ferric chloride. This agent readily dissolves the copper sheet and has substantially no effect upon the silver or the permanent base.

The removal of the base sheet 11 from the inlaid printed circuit by a solvent for that sheet which is substantially inert toward the materials of the inlaid circuit, is practicable regardless of the nature of the bond between the base sheet and any of the materials of the inlaid circuit. Accordingly, the firmest possible metal-to-metal bond is permitted between the conducting portions of the inlaid circuit and the base sheet. More specifically, where the conducting materials of the inlaid circuit are electrolytically deposited on the base sheet, the surface of the base sheet may be, and preferably is, chemically clean at the time of the electrolytic deposition, whereby the conducting portion of the inlaid circuit and the base sheet become substantially a single piece of metal.

Where this process is employed the insulating material which is to form the permanent base of the inlaid circuit may be applied to the exposed surfaces of the metal sheet and of the electrolytically deposited metal under the severest conditions of pressure and temperature without fear that the insulating material may seep between the base sheet and the conducting material which has been electrolytically deposited thereon. Also, there is no possibility that any portion of the conducting material may be moved laterally along the surface of the base sheet to distort the pattern of the ultimate inlaid printed circuit. Accordingly, employment of the process described above positively assures an accurate, flush, inlaid printed circuit.

Where the ultimate inlaid circuit requires a particularly tight bond between the conducting portions 13 and the permanent base 14, this may be accomplished without regard for the firmness of the bond between the permanent base 14 and the base sheet 11. For example, a relatively rigid permanent base 14 may be coated with an effective adhesive, such as an epoxy resin. This may be pressed against the assembly of Fig. 5 as illustrated in Fig. 6, such that the adhesive coating flows over and firmly contacts all areas of the conducting material 13 and the exposed portions of the lower surface of the base sheet 11. An adhesive of the character suggested above will provide a very tight bond between the permanent base 14 and the conducting material 13. Naturally, a very tight bond will also result between the permanent base 14 and the base sheet 11, whereby it would be impossible to strip the inlaid circuit from the base sheet. Such an adhesive may, for example, have an adherence for the conducting material and for the base sheet of a value on the order of 5000 pounds per square inch, an adherence many times too large to permit stripping of the inlaid circuit from the base sheet. This firm bond, as in the case of the firm bond between the conducting material 13 and the base sheet 11, has no effect on the process since the base sheet 11 is removed by a solvent.

In accordance with the invention, then, the base sheet 11 is readily removed without regard to the firmness of the bond between the base sheet and any portion of the inlaid circuit. The invention therefore permits the firmest possible bond between the conducting material and the base sheet 11 and the firmest possible bond between the permanent base 14 and the assembly of Fig. 5, while permitting ready removal of the base sheet in spite of these firm bonds.

Many alternatives of the basic process may be employed while still retaining the basic advantages of the preferred embodiment described above. For example, the photosensitive resist of the preferred embodiment may be replaced by a resist which is applied to the base sheet 11 by printing, rolling, or screening. The photosensitive coating is preferred because greater accuracy is possible with this form of resist than with printing, rolling, or screening. The latter methods are generally somewhat less expensive, however, and may therefore be preferred where great accuracy in the circuit is not required.

Various materials may be employed for the resist, especially where it is applied by printing, rolling, or screening. By way of example, the resist may be of the same material as, or may be of a material compatible with, the material employed as the permanent base. In this case the resist need not be removed from the base sheet 11 after the deposition of the conducting material. Instead, the material for the permanent base may be applied against the exposed surface of the conducting material and against the surrounding area under conditions of suitable temperature and pressure. The resist material then ultimately constitutes a portion of the permanent base, and more specifically constitutes that portion which appears on the flush surface of the completed inlaid circuit. Any form of resist may, of course, be used in this manner, but where the photosensitive resist of the preferred embodiment is employed, this material is a relatively unstable material to use as a part of the permanent base.

Where the conducting portion of the inlaid circuit will not be subjected to severe abrasion or temperature, a soft (low melting temperature) metal may be employed therefor. In this case the conducting metal rather than being electrolytically deposited, may be applied by dipping the assembly of Fig. 3 into a bath of the desired molten metal, such as a tin lead solder, or the molten metal may be applied by spraying. This method of applying the conducting material to the base sheet 11 may be somewhat less expensive than the electrolytic process and would be desirable for that reason where the metals which might be so applied are satisfactory in view of the intended use of the ultimate inlaid circuit.

Zinc may be employed for the base sheet 11 in which case it may be removed in the final step by a 10% solution of nitric acid. Aluminum may also be employed for the base sheet, in which case the aluminum sheet may be removed in the final step by a strong lye solution (on the order of 6 ounces of lye per gallon of water). If aluminum is to be used for the base sheet 11, and if a photosensitive resist is to be employed such as that described in the preferred embodiment of the invention, it is preferable that the residue coating 12' be removed, as in Fig. 5, by an agent other than the lye solution suggested, since the lye would attack the aluminum base sheet. The residue coating may, for example, be removed in this case by trisodium phosphate.

Still further, if the intended use of the inlaid circuit makes it necessary to employ nickel as the conducting material, a copper base sheet 11 may be employed. In this case the base sheet may be removed in the final step of the process by chromic acid, which latter is substantially inert toward nickel.

In accordance with several embodiments of the invention, described below, no resist need be applied to the base sheet 11 prior to the bonding thereto of the conducting material of the inlaid circuit. For example, the base sheet 11 may have a suitable soldering flux applied thereto in the pattern of the desired circuit. The base sheet 11 may then be dipped in a bath of molten solder, with the result that the solder will adhere to the base sheet in the desired pattern, that is, where the flux was previously applied. The flux may be applied by any suitable method such as painting, rolling, screening, or printing. Another alternative which would require no resist, as such, involves the spraying of molten metal against the base sheet 11 through a stencil. Still another possibility involves the selective application of molten solder to the base sheet by printing or rolling. In all cases, of course, the base sheet 11 would ultimately be removed by a solvent which is substantially inert toward the materials of the inlaid circuit. While none of these three methods would produce a printed circuit of extreme accuracy, they illustrate that the invention is not limited to the use of a resist.

In the various embodiments described above the solvents recommended for removing the base sheet 11 have substantially no effect on the materials of the inlaid circuit. However, in the interest of economy or rapidity of action it may be desired to use some certain solvent in spite of its having appreciable effect on some part of the inlaid circuit. For example, a weak solution of ferric chloride might be used to remove an aluminum base sheet 11 where copper is used for the conducting portion of the inlaid circuit. The solvent would have appreciable effect on the copper but would act so much faster on the aluminum than on the copper that careful use of such a solvent with these materials would be practicable if the intended use of the inlaid circuit would permit some pitting of the copper. Accordingly, where it is stated herein that the solvent for the base sheet 11 is "substantially inert" toward the materials of the inlaid circuit, it is to be understood that the degree of inertness need be only such that the final product is acceptable for the use intended.

The above suggested alternatives to the preferred embodiment of the invention are far from being all inclusive and are intended only to illustrate that the invention lends itself readily to many embodiments without departing from the spirit of the invention. More specifically, each of the alternatives suggested above permits the removal of the base sheet 11 by a solvent which is relatively inert toward the various materials of the ultimate inlaid circuit. This step of the process permits the tightest possible bond between the materials of the inlaid circuit and the base sheet 11, whereby it is assured that the conducting elements of the inlaid circuit will cling securely to the base sheet 11 during the application of the materials which are to form the permanent base.

While particular embodiments of the invention have been shown, it will be understood, of course, that the invention is not limited thereto since many modifications may be made, and it is, therefore, contemplated to cover by the appended claims any such modifications as fall within the true spirit and scope of the invention.

The invention having thus been described, what is claimed and desired to be secured by Letters Patent is:

1. A process for producing an inlaid circuit which comprises, applying metal in a desired circuit pattern to one surface of a metal sheet in metal-to-metal contact therewith, applying an insulating material in plastic form against said applied metal and against the adjacent areas to form an inlaid circuit, and removing said metal sheet by treating with a solvent for such sheet which is substantially inert toward the materials of said inlaid circuit.

2. A process for producing an inlaid circuit which comprises, applying conducting material in a desired circuit pattern to one surface of a metal sheet, applying an insulating material in plastic form against said conducting material and against the exposed portion of said one surface of said sheet, and removing said sheet to which said conducting material and said insulating material are applied by treating with a solvent for said sheet which is substantially inert toward said conducting material and said insulating material.

3. A process for producing an inlaid circuit which comprises, applying a nonconducting material to one surface of a metal sheet in the negative of a desired circuit pattern, applying conducting material by electrolysis to the exposed portions of said one surface of said metal sheet, applying an insulating material in plastic form against said conducting material and against the adjacent areas to form an inlaid circuit, and removing said metal sheet by treating with a solvent for said sheet which is substantially inert toward the materials of said inlaid circuit.

4. A process for producing an inlaid circuit which comprises, applying a nonconducting material to one surface of a metal sheet in the negative of a desired circuit pattern, applying conducting material by electrolysis to the exposed portions of said one surface of said metal sheet, removing said nonconducting material by treating with a solvent for said material which is substantially inert toward said sheet and said conducting material, applying an insulating material in plastic form against said conducting material and against the exposed portion of said one surface of said sheet, and removing said sheet by treating with a solvent for said sheet which is substantially inert toward said conducting material and said insulating material.

5. A process for producing an inlaid circuit which comprises, applying a nonconducting material to one surface of a metal sheet in the negative of a desired circuit pattern, applying conducting material by electrolysis to the exposed pattern of said one surface of said metal sheet, applying an insulating material in plastic form against said conducting material and against said nonconducting material, and removing said metal sheet by treating with a solvent for said sheet which is substantially inert toward said conducting material, said nonconducting material and said insulating material.

6. A process for producing an inlaid circuit which comprises applying a nonconducting material to one surface of a metal sheet in the negative of a desired circuit pattern, bonding metal to the exposed portions of said one surface of said metal sheet in metal-to-metal contact therewith, applying an insulating material in plastic form against said bonded metal and against the adjacent areas to form an inlaid circuit, and removing said metal sheet by treating with a solvent for said sheet which is substantially inert toward the materials of said inlaid circuit.

7. A process for producing an inlaid circuit which comprises, applying conducting material in a desired circuit pattern to one chemically clean surface of a metal sheet, applying an insulating material in plastic form against said conducting material and against the exposed portion of said one surface of said sheet, and removing said sheet to which said conducting material and said insulating material are applied by treating with a solvent for said sheet which is substantially inert toward said conducting material and said insulating material.

8. A process for producing an inlaid circuit which comprises, applying conducting material in a desired circuit pattern to one surface of a metal sheet, applying an insulating material in plastic form against said conducting material and against the adjacent areas to form an inlaid circuit, and removing said sheet by treating with a solvent for said sheet which is substantially inert toward the materials of said inlaid circuit.

9. A process for producing an inlaid circuit which comprises, applying a nonconducting material to one surface of a metal sheet in the negative of a desired circuit pattern, applying metal to the exposed portions of said one surface of said metal sheet by treating said one surface with molten metal, removing said nonconducting material by treating with a solvent for said material which is substantially inert toward said sheet and said applied metal, applying an insulating material in plastic form against said applied metal and against the exposed portion of said one surface of said sheet, and removing said sheet by treating with a solvent for said sheet which is substantially inert toward said applied metal and said insulating material.

10. The process of claim 3, wherein said metal sheet is copper, said conducting material is silver, and said solvent is a water solution of ferric chloride.

11. The process of claim 3, wherein said metal sheet is copper, said conducting material is nickel, and said solvent is chromic acid.

12. The process of claim 3, wherein said metal sheet is aluminum, said solvent is a lye solution, and in which said conducting material is relatively inert to said lye solution.

13. The process of claim 3, wherein said metal sheet is zinc, said solvent is a 10% solution of nitric acid and said conducting material is relatively inert to said 10% solution of nitric acid.

References Cited in the file of this patent

UNITED STATES PATENTS

| Number | Name | Date |
|---|---|---|
| 1,804,021 | Miller | May 5, 1931 |
| 2,215,507 | Hunlock | Sept. 24, 1940 |
| 2,408,220 | Lum | Sept. 24, 1946 |
| 2,447,541 | Sabee et al. | Aug. 24, 1948 |